(12) United States Patent
Mayer et al.

(10) Patent No.: US 11,435,436 B2
(45) Date of Patent: Sep. 6, 2022

(54) RADAR SENSOR SYSTEM AND METHOD FOR SUPPLYING A FREQUENCY

(71) Applicant: Robert Bosch GmbH, Stuttgart (DE)

(72) Inventors: Marcel Mayer, Lonsee (DE); Klaus Baur, Mietingen (DE); Michael Schoor, Stuttgart (DE)

(73) Assignee: Robert Bosch GmbH, Stuttgart, NY (US)

(*) Notice: Subject to any disclaimer, the term of this patent is extended or adjusted under 35 U.S.C. 154(b) by 145 days.

(21) Appl. No.: 16/765,156

(22) PCT Filed: Nov. 8, 2018

(86) PCT No.: PCT/EP2018/080606
§ 371 (c)(1),
(2) Date: May 18, 2020

(87) PCT Pub. No.: WO2019/137652
PCT Pub. Date: Jul. 18, 2019

(65) Prior Publication Data
US 2020/0348391 A1    Nov. 5, 2020

(30) Foreign Application Priority Data
Jan. 11, 2018    (DE) .......................... 102018200385.8

(51) Int. Cl.
*G01S 7/03*    (2006.01)
*G01S 7/282*    (2006.01)
(Continued)

(52) U.S. Cl.
CPC ................ *G01S 7/03* (2013.01); *G01S 7/282* (2013.01); *G01S 13/931* (2013.01); *H03L 7/099* (2013.01)

(58) Field of Classification Search
CPC .......... G01S 7/03; G01S 7/282; G01S 13/931; H03L 7/099
(Continued)

(56) References Cited

U.S. PATENT DOCUMENTS 4,010,468 A * 3/1977 Fishbein ................. G01S 13/02
342/92
4,110,754 A * 8/1978 Endo ...................... G01S 13/931
342/201
(Continued)

FOREIGN PATENT DOCUMENTS

DE    69226627 T2    12/1998
EP    2881752 A1 *    6/2015 .......... B60W 30/143
(Continued)

OTHER PUBLICATIONS

International Search Report for PCT/EP2018/080606, dated Apr. 3, 2019.

*Primary Examiner* — Bernarr E Gregory
*Assistant Examiner* — Nuzhat Pervin
(74) *Attorney, Agent, or Firm* — Norton Rose Fulbright US LLP; Gerard Messina

(57) ABSTRACT

A radar sensor system for transmitting and receiving radar waves. The system includes a first sub-sensor having a first antenna and a first antenna control for operating the first antenna, and a second sub-sensor including a second antenna and a second antenna control for operating the second antenna. The system further includes a frequency-generating device having a clock pulse generator for generating a usable frequency and having a control unit for actuating and controlling the first antenna control, the second antenna control and the frequency-generating device, the frequency-generating device having a first clock pulse generator and a second clock pulse generator, the first clock pulse generator and the second clock pulse generator being (Continued)

able to be connected via at least two multiplexers to the first antenna control and the second antenna control for the supply of a usable frequency in each case.

11 Claims, 1 Drawing Sheet

(51) Int. Cl.
 *G01S 13/931* (2020.01)
 *H03L 7/099* (2006.01)
(58) Field of Classification Search
 USPC ........................................................ 342/202
 See application file for complete search history.

(56) References Cited

U.S. PATENT DOCUMENTS

| | | | | |
|---|---|---|---|---|
| 4,143,369 A * | 3/1979 | Ayers | ................ | G01S 7/42 |
| | | | | 307/41 |
| 4,694,297 A * | 9/1987 | Sewards | ............ | G01S 13/767 |
| | | | | 342/51 |
| 4,926,498 A * | 5/1990 | Suzuki | ............. | H04B 7/0817 |
| | | | | 455/135 |
| 5,625,324 A * | 4/1997 | Hsu | ................ | H03L 7/22 |
| | | | | 331/25 |
| 6,232,910 B1 * | 5/2001 | Bell | ................ | G01S 13/18 |
| | | | | 342/134 |
| 6,989,782 B2 * | 1/2006 | Walker | .............. | G01S 13/284 |
| | | | | 342/134 |
| 7,589,665 B2 * | 9/2009 | Heide | ............... | G01S 13/003 |
| | | | | 342/134 |
| 9,229,102 B1 * | 1/2016 | Wright | .............. | G01S 13/885 |
| 9,261,587 B1 * | 2/2016 | Gwinn, IV | ........... | G01S 7/03 |
| 9,418,551 B2 * | 8/2016 | Kavaler | ............. | B60W 30/06 |
| 11,019,246 B2 * | 5/2021 | Sivan | ............... | G06F 3/013 |
| 2004/0085140 A1 * | 5/2004 | Yi | .................. | H03K 5/15066 |
| | | | | 331/16 |
| 2006/0197701 A1 * | 9/2006 | Heide | ............... | G01S 7/032 |
| | | | | 342/127 |
| 2011/0084880 A1 * | 4/2011 | Sakai | ............... | G01S 7/282 |
| | | | | 342/375 |
| 2013/0278306 A1 * | 10/2013 | Wixforth | ............ | G01S 7/354 |
| | | | | 327/299 |
| 2014/0064409 A1 * | 3/2014 | Bisig | ............... | H04B 7/0404 |
| | | | | 375/299 |
| 2015/0153445 A1 * | 6/2015 | Jansen | ............. | G01S 13/003 |
| | | | | 342/195 |
| 2017/0090015 A1 * | 3/2017 | Breen | ............... | G01S 7/032 |

FOREIGN PATENT DOCUMENTS

| | | | | |
|---|---|---|---|---|
| EP | 2881752 A1 | 6/2015 | | |
| EP | 3339899 A1 | 6/2018 | | |
| JP | S60100779 A | 6/1985 | | |
| KR | 101682652 B1 * | 12/2016 | ........... | G01S 13/103 |
| WO | WO-2011123065 A1 * | 10/2011 | ............ | G01S 5/04 |
| WO | 2017054962 A1 | 4/2017 | | |
| WO | WO-2017054962 A1 * | 4/2017 | ............ | G01S 13/34 |
| WO | 2017157026 A1 | 9/2017 | | |
| WO | WO-2017157026 A1 * | 9/2017 | ............ | H03K 3/017 |

\* cited by examiner

RADAR SENSOR SYSTEM AND METHOD FOR SUPPLYING A FREQUENCY

FIELD

The present invention relates to a radar sensor system for transmitting and receiving radar waves, and to a method for supplying a frequency.

BACKGROUND INFORMATION

The market for driver-assistance systems is currently in transition. While it was mainly cost-effective sensor systems that stood in the foreground during the past few years, there is currently a trend toward highly autonomous driving that makes much greater demands on the sensor system. More and more sensors for the control and regulation of the functions are installed in vehicles that offer a high degree of driver-assistance functions or automated driving functions. The sensors installed in the vehicles could be radar sensors or lidar sensors, for instance, and have to provide the highest accuracy possible. Through the use of precise sensors, the functional safety and the reliability of the autonomous or semi-autonomous driving functions are able to be ensured.

In vehicles featuring autonomous driving functions or automated driver-assistance functions, errors, in particular E/E errors according to ISO26262, lead to the attainment of a safe state, e.g., to the deactivation of the respective radar sensor or the bus communication. In the case of radar sensors that offer high performance and are equipped with many antennas, HF channels and memories, the probability of a failure increases considerably. According to ISO26262, this probability is determined in FIT (termed Failure In Time, $10^{-9}$/h). A component may thus have maximally 100 FIT according to ASIL-B or ASIL-C before it will be deactivated. The safe state of the respective component is not considered in this context. For example, if a quartz oscillator has 30 FIT and the safe state is unable to be reached, then this quartz oscillator alone already takes up 30% of the available FIT rates of the radar sensor.

SUMMARY

An object of the present invention is to provide a redundant method for supplying a frequency and an improved radar sensor system that features an emergency operating mode.

This object may be achieved by example embodiments of the present invention. Advantageous further developments of the present invention are described herein.

According to one aspect of the present invention, an example radar sensor system is provided for transmitting and receiving radar waves. The example radar sensor system has a first sub-sensor having at least one first antenna for transmitting and receiving radar waves and including at least one first antenna control for operating the at least one first antenna. In addition, the radar sensor system has at least one second sub-sensor having at least one second antenna for transmitting and receiving radar waves and including at least one second antenna control for operating the at least one second antenna. A frequency-generating device having at least one clock pulse generator is used for generating a usable frequency. A control unit of the radar sensor device is used for actuating and controlling the first antenna control, the at least one second antenna control, and the frequency-generating device. According to the present invention, the frequency-generating device has a first clock pulse generator and at least one second clock pulse generator, and the first clock pulse generator and the at least one second clock pulse generator are able to be connected via at least two multiplexers to the at least one first antenna control and the at least one second antenna control for the supply of a usable frequency in each case.

Generally, current radar sensors have many HF channels for generating and receiving radar waves. All high-frequency components may be operating simultaneously during a normal operation. If such radar sensors have a symmetrical development, they are able to be subdivided into a plurality of sub-sensors. Each sub-sensor may then have a corresponding share of high-frequency components or high-frequency channels of the radar sensor. As a result, for example, one sub-sensor of the radar sensor may allow for the autonomous driving of a vehicle at a limited speed during a possible emergency operation. This may be realized even if components of other sub-sensors are no longer operative.

The structure of the radar sensor system may be made up of conventional, cost-effective basic components, for example. By parallelizing multiple components of the same type, the performance and the accuracy of the radar sensor system are able to be improved. In addition, a redundancy is realizable in order to ensure the reliable functioning of the system by using multiple components of the same type. An emergency operation of the radar sensor system is thereby technically easily implementable. However, in addition to the high-frequency components and the microcontroller, redundancy must also be provided in the clock pulse generation. The high-frequency components, for example, may be antenna controls or amplifiers, which are developed in the form of MMICs (Monolithic Microwave Integrated Circuit).

The frequency-generating device has at least two clock pulse generators for generating a usable frequency. The usable frequency, for instance, may be used to generate the radar waves with the usable frequency through the transmission antenna. Alternatively, the usable frequency is able to be modulated prior to the transmission. Each one of the at least two clock pulse generators is able to be connected to at least two multiplexer components. In this way, the high-frequency components such as the antenna controls are able to be supplied with a usable frequency by the first clock pulse generator or by the at least one second clock pulse generator. In the event of a malfunction of a clock pulse generator, the at least one second clock pulse generator is therefore able to take over the clock pulse supply of the high-frequency components of the radar sensor system. The switchover process of the clock pulse generators is able to be controlled by the control unit, for instance.

Since all high-frequency components are supplied with a usable frequency or a basic frequency by a shared clock pulse generator, the radar sensor system has a high coherence. The different sub-sensors are able to be operated at an identical frequency, in particular. This allows for a redundant and coherent clock pulse supply of a plurality of high-frequency components.

According to one exemplary embodiment of the radar sensor system in accordance with the present invention, the first clock pulse generator and the at least one second clock pulse generator are able to be connected via the at least two multiplexers to the at least one first antenna control and the at least one second antenna control for the supply of the usable frequency in each case. This makes it possible to create redundancy in the clock pulse generation.

According to another exemplary embodiment of the radar sensor device in accordance with the present invention, the first clock pulse generator and the at least one second clock pulse generator are able to be operated in a mutually phase-shifted manner in order to increase a clock pulse frequency. If the mutual adaptation of the phase shift of the frequencies of the at least two clock pulse generators is realized, then the clock pulse pauses or clock pulse gaps of one clock pulse generator are able to be filled by the respective other clock pulse generator. Frequency doubling is therefore able to be carried out with the aid of two clock pulse generators using a single frequency, for instance.

According to an additional exemplary embodiment of the radar sensor system in accordance with the present invention, the first clock pulse generator and the at least one second clock pulse generator are optionally able to be connected via the at least two multiplexers to the at least one first antenna control and to the at least one second antenna control for the supply of the usable frequency in each case. Via the control unit, the multiplexers may act as switches for alternating voltages of the respective clock pulse generators and thus allow generated frequencies to pass or to be blocked. Alternatively, the control unit is able to activate only one clock pulse generator of the at least two clock pulse generators. In an emergency operation, the appropriate clock pulse generator or the generated usable frequency is able to be flexibly routed to the high-frequency components via the control unit.

According to a further exemplary embodiment of the radar sensor system in accordance with the present invention, the at least one second clock pulse generator is able to be activated in the event of a defect of the first clock pulse generator. If the entire radar sensor or the entire radar sensor system is developed in such a way that a sub-sensor of a plurality of sub-sensors is sufficient for an emergency operation, then an operativeness of at least one sub-sensor is realizable even if at least one clock pulse generator or one multiplexer is defective. In this instance, either the at least one second clock pulse generator is able to generate an alternating voltage with a frequency or the at least one second multiplexer is able to convey the generated alternating voltage to at least one sub-sensor. At least a portion of the MMICs used in the radar sensor system is therefore able to be supplied with a clock pulse or a usable frequency. During a normal operation, all MMICs or antenna controls of the radar sensor system are able to be supplied with the same clock pulse by the at least one clock pulse generator so that all data are thus able to be offset against one another.

According to one further exemplary embodiment of the radar sensor system in accordance with the present invention, the control unit is able to activate or deactivate the first clock pulse generator and the at least one second clock pulse generator. In this way, the clock pulse generators may be flexibly controlled or regulated by the control unit. Different operating modes, in particular, are thereby technically easy to implement. For example, the clock pulse generators may be voltage-controlled oscillators, which are adjustable in their frequency by the control unit.

According to another exemplary embodiment of the radar sensor system in accordance with the present invention, in the event of a defect of one of the at least two multiplexers, the first clock pulse generator or the at least one second clock pulse generator is able to be connected to the at least one first antenna control or the at least one second antenna control for the supply of the usable frequency. This allows for the realization of an emergency operation of the radar sensor system in which at least one sub-sensor is able to be maintained in its function, i.e., the generation and the receiving of radar waves. Thus, notwithstanding a lower performance of the radar sensor system during the emergency operation, the radar function may suffice for an autonomous travel at a reduced speed. As a result, the radar sensor system offers greater reliability and operational safety.

According to a further exemplary embodiment of the radar sensor system in accordance with the present invention, the control unit is able to activate or deactivate the at least two multiplexers independently of each other. Preferably, the at least two multiplexers may be connected to the control unit in such a way that the control unit has the ability to activate, switch through or block the multiplexers as a function of the respective operating mode. This allows for redundancy of the multiplexers of the radar sensor system.

According to another exemplary embodiment of the radar sensor system in accordance with the present invention, the at least two multiplexers are bridgeable by the control unit independently of each other. In the event of a malfunction of a clock pulse generator and a multiplexer, for instance, an operativeness of at least one sub-sensor of the radar sensor system may therefore be technically implemented nevertheless. Such an emergency operation may correspond to a clock pulse generation in a conventional radar sensor.

According to another exemplary embodiment of the radar sensor system in accordance with the present invention, the first sub-sensor and the at least one second sub-sensor have at least one antenna for transmitting radar waves and at least one antenna for receiving radar waves in each case. In this way, the radar sensor system may be made up of a plurality of sub-sensors in a modular manner, thereby making it possible to reliably maintain the operation of the radar sensor system even if a partial malfunction or a partial defect of components is encountered.

According to a further exemplary embodiment of the radar sensor system in accordance with the present invention, the first clock pulse generator and/or the at least one second clock pulse generator is/are a phase-locked loop including at least one oscillator or an oscillator circuit. In an embodiment of the clock pulse generators in the form of a phase-locked loop, the frequency generated by the oscillator is able to be kept particularly stable. The oscillator may be a voltage-controlled oscillator in this instance. Alternatively, a voltage-controlled oscillator is also able to be used directly as a clock pulse generator, so that the frequency-generating device may be developed in a technically especially uncomplicated manner. In addition, the phase-locked loop may also be developed in a digital fashion in the form of a microcontroller. Such a microcontroller may be situated in the radar sensor system either separately or be combined with the control unit. Alternatively or additionally, the frequency-generating device is able to be integrated into the control unit.

According to a further aspect of the present invention, an example method for supplying a usable frequency is provided, in particular for a radar sensor system. In one step, a first clock pulse generator supplies a usable frequency via at least two multiplexers, disposed in parallel, to at least one first antenna control and at least one second antenna control. In the event of a defect of the first clock pulse generator, the usable frequency is supplied by at least one second clock pulse generator, which is able to be connected via a control unit, by way of the at least two multiplexers situated in parallel, to the at least one first antenna control and the at least one second antenna control. In the event of a defect of a multiplexer, the usable frequency is supplied by the first clock pulse generator and/or by the at least one second clock pulse generator via at least one functioning multiplexer to the at least one first antenna control or the at least one second antenna control.

During a normal operation of the radar sensor system, at least one clock pulse generator provides a simultaneous clock pulse supply of all antenna controls or MMICs. The clock pulse supply from one source makes it possible to realize a high coherence. Alternatively or additionally, the clock pulse supply may be made up of a plurality of clock pulse generators, which are operated in parallel. If a clock pulse generator exhibits a defect, for instance, then at least one further clock pulse generator is able to be activated or connected via the control unit for generating a frequency. Despite a defective clock pulse generator, all antenna controls are therefore able to be operated in the proper manner. For instance, if one of the multiplexers is unavailable as a result of a defect, then at least a portion of the radar sensor system may continue to have an electrically conductive connection to at least one clock pulse generator, and thus have a clock pulse supply. Such a radar sensor system is able to be used in an emergency operation of a vehicle.

Below, preferred exemplary embodiments of the present invention are described in greater detail with the aid of heavily simplified schematic figures.

BRIEF DESCRIPTION OF THE DRAWINGS

In the figures, the same constructive elements have been provided with the same reference numerals in each case.

DETAILED DESCRIPTION OF EXAMPLE EMBODIMENTS

Figure 1:
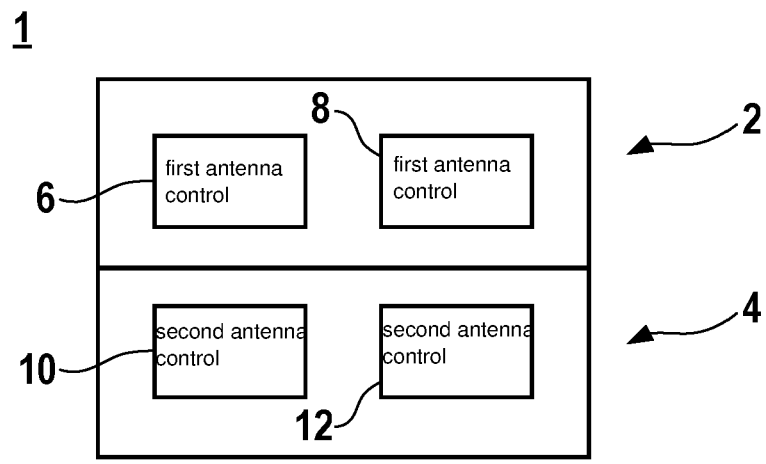
FIG. 1 shows a schematic illustration of the subdivision of a radar sensor system according to a first specific embodiment of the present invention

FIG. 1 shows a schematic depiction in order to illustrate the subdivision of a radar sensor system 1 according to a first specific embodiment of the present invention. Radar sensor system 1 is made up of a first sub-sensor 2 and a second sub-sensor 4. First sub-sensor 2 has two first antenna controls 6, 8, and second sub-sensor 4 has two second antenna controls 10, 12. For the sake of simplicity, the further components of radar sensor system 1, e.g., antennas, amplifiers and the like, are not shown. The two sub-sensors 2, 4 may be used in parallel with each other and separately of each other for generating and receiving of radar waves.

Figure 2:
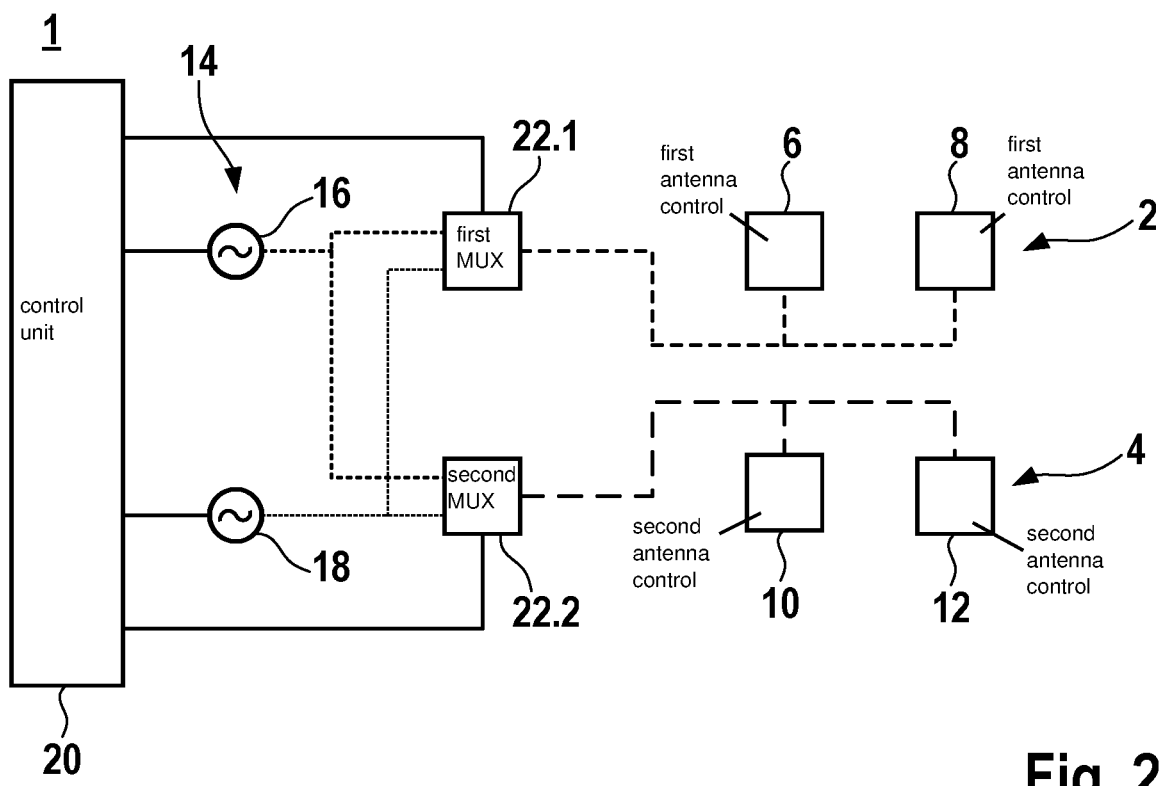
FIG. 2 shows a schematic illustration of a radar sensor system according to the first specific embodiment of the present invention.

FIG. 2 shows a schematic illustration of radar sensor system 1 according to the first specific embodiment of the present invention. In particular, a detailed view of the frequency-generating device 14 is illustrated.

According to the specific embodiment, the frequency-generating device 14 is made up of a first clock pulse generator 16 and a second clock pulse generator 18. The two clock pulse generators 16, 18 are connected to a control unit 20. For instance, clock pulse generators 16, 18 may be voltage-controlled oscillators or phase-locked loops.

Control unit 20 is able to adjust respective clock pulse generators 16, 18 in their frequencies and in particular switch clock pulse generators 16, 18 on and off individually and optionally. In addition, control unit 20 is capable of implementing the configuration of a mutual phase shift of the two clock pulse generators 16, 18.

Each clock pulse generator 16, 18 is connected to two multiplexers 22 in each case. Multiplexers 22 are situated in parallel with each other. Clock pulse generators 16, 18 are coupled in a mutually parallel manner with the two multiplexers 22 disposed in parallel, so that each clock pulse generator 16, 18 is able to conduct an alternating voltage with a frequency via both multiplexers 22 independently of each other. A sub-sensor 2, 4 is connected to each of the two multiplexers 22. Through a first multiplexer 22.1, in particular, the two first antenna controls 6, 8 are able to be supplied with a frequency by the frequency-generating device 14. The two second antenna controls 10, 12 are connected to second multiplexer 22.2 in an electrically conductive manner, so that a clock pulse supply is ensured by frequency-generating device 14. Both multiplexers 22 are also coupled in control unit 20 and are controllable by control unit 20. In particular, multiplexers 22 are able to be activated, deactivated or switched through independently of each other.

What is claimed is:

1. A radar sensor system for transmitting and receiving radar waves, comprising:
    a first sub-sensor including at least one first antenna for transmitting and receiving radar waves, and at least one first antenna control configured to operate the at least one first antenna;
    at least one second sub-sensor including at least one second antenna for transmitting and receiving radar waves, and at least one second antenna control configured to operate the at least one second antenna;
    a frequency-generating device having at least one clock pulse generator configured to generate a usable frequency; and
    a control unit configured to actuate and control the first antenna control, the at least one second antenna control, and the frequency-generating device;
    wherein the frequency-generating device has a first clock pulse generator and at least one second clock pulse generator, each of the first clock pulse generator and the at least one second clock pulse generator being connectable, via at least two multiplexers, to the at least one first antenna control and to the at least one second antenna control, to supply the usable frequency to the at least one first antenna control and the at least one second antenna control.

2. The radar sensor system as recited in claim 1, wherein the first clock pulse generator and the at least one second clock pulse generator are operable in a mutually phase-shifted manner in order to increase a clock frequency.

3. The radar sensor system as recited in claim 1, wherein each of the first clock pulse generator and the at least one second clock pulse generator are optionally able to be connected via the at least two multiplexers to the at least one first antenna control and the at least one second antenna control to supply the usable frequency to the at least one first antenna control and the at least one second antenna control.

4. The radar sensor system as recited in claim 1, wherein the at least one second clock pulse generator is activatable in the event of a defect of the first clock pulse generator.

5. The radar sensor system as recited in claim 1, wherein the control unit is configured to activate and deactivate the first clock pulse generator and the at least one second clock pulse generator.

6. The radar sensor system as recited in claim 1, wherein in the event of a defect of one of the at least two multiplexers, the first clock pulse generator or the at least one second clock pulse generator is able to be connected to the at least one first antenna control or to the at least one second antenna control for the supply of the usable frequency.

7. The radar sensor system as recited in claim 1, wherein the control unit is configured to activate and deactivate the at least two multiplexers independently of each other.

8. The radar sensor system as recited in claim 1, wherein the at least two multiplexers are bridgeable by the control unit independently of each other.

9. The radar sensor system as recited in claim 1, wherein the first sub-sensor and the at least one second sub-sensor each have at least one antenna for transmitting radar waves and at least one antenna for receiving radar waves.

10. The radar sensor system as recited in claim 1, wherein the first clock pulse generator and/or the at least one second clock pulse generator have a phase-locked loop including at least one oscillator or an oscillator circuit.

11. A method for supplying a usable frequency, for a radar sensor system, the method comprising the following steps:

supplying, by a first clock pulse generator, a usable frequency, via at least two multiplexers disposed in parallel, to at least one first antenna control and at least one second antenna control, the at least one first antenna control being configured to operate at least one first antenna and the at least one second antenna control being configured to operate at least one second antenna;

in the event of a defect in the first clock pulse generator, supplying, by at least one second pulse generator, the usable frequency, to the at least one first antenna control and the at least one second antenna control, the at least one second pulse generator being connectable via a control unit by way of the at least two multiplexers situated in parallel, to the at least one first antenna control and the at least one second antenna control; and in the event of a defect of one of the two multiplexers, supplying the usable frequency by the first clock pulse generator and/or by the at least one second clock pulse generator, via at least another one of the multiplexers, to the at least one first antenna control or the at least one second antenna control.

* * * * *